United States Patent [19]

Takada

[11] 4,371,796
[45] Feb. 1, 1983

[54] JOSEPHSON LOGIC GATE DEVICE

[75] Inventor: Susumu Takada, Musashi-Murayama, Japan

[73] Assignees: Agency of Industrial Science & Technology; Ministry of International Trade & Industry, both of Tokyo, Japan

[21] Appl. No.: 181,855

[22] Filed: Aug. 27, 1980

[30] Foreign Application Priority Data

Aug. 27, 1979 [JP] Japan .................. 54/108129

[51] Int. Cl.³ .................. H03K 19/195; H03K 17/92
[52] U.S. Cl. .................. 307/476; 307/245; 307/462; 307/277; 357/5
[58] Field of Search .......... 307/462, 476, 245, 306, 307/277; 357/5; 365/162

[56] References Cited

U.S. PATENT DOCUMENTS 4,117,354 9/1978 Geewala .................. 307/306
4,275,314 6/1981 Fulton .................. 307/462

OTHER PUBLICATIONS

H. H. Zappe, "Josephson Quantum Interference Computer Devices", IEEE Transactions on Magnetics, vol. MAG—13, No. 1, pp. 41–47, Jan., 1977.

T. R. Gheewala, "Josephson Logic Circuits Based on Nonlinear Current Injection in Interferometer Devices", Applied Physics Letter, vol. 33 (8), pp. 781–783, Oct. 15, 1978.

T. A. Fulton et al., "A Simple High—Performance Current—Switched Josephson Gate", Applied Physics Letter, vol. 34 (10), pp. 709–711, May 15, 1979.

Primary Examiner—John Zazworsky
Attorney, Agent, or Firm—Kurt Kelman

[57] ABSTRACT

A Josephson logic gate device comprises a closed loop of four Josephson junctions, a gate line and a ground line connected to the closed loop at symmetrically opposite points, and a control line connected to the closed loop at the intermediate joint between the gate line and ground line. This logic gate produces a switching function in which the gate current fed to the gate line is steered from the gate to the load by the transition between the zero-voltage state and the voltage state of the device when a control current is supplied into the control line.

4 Claims, 17 Drawing Figures

JOSEPHSON LOGIC GATE DEVICE

BACKGROUND OF THE INVENTION

This invention relates to a Josephson logic gate device which consists of a closed loop of four Josephson junctions and acts a high-speed switching operation by current injection and relates to a logic circuit which is integrated with a lot of such Josephson logic gate devices.

In the field of electronic computers which is constantly striving for improvements in operational speed and performance, the silicon semiconductor devices used in most electronic computers have begun to reach a limit in operating speed, and Josephson devices have recently begun to attract keen attention as one potential novel break-through. The Josephson device exhibits an excellent property of performing a high-speed switching operation with low power dissipation and high sensitivity in accordance with the Josephson effect produced in a superconductive state at very low temperatures. Therefore, the Josephson device has given rise to expectations for materialization of super-high speed computers. This device, in its basic construction, comprises two superconductors joined to each other through the medium of a thin insulating film (Josephson tunneling junction) as typified by the Josephson tunnel junction device. In this construction, when the current supplied to the junction is varied so much as to exceed the critical current, the device is transferred from the zero-voltage state to the voltage state (a switching operation). With this basic construction unaltered, the device's sensitivity which is defined by the slope in the threshold curve of input-output characteristics, is low and its operation is deficient in stability.

With a view to improving the performance of the basic switching device, there have been proposed magnetically controlled devices (inline gate type; e.g., H. H. Zappe "Josephson quantum interference computer devices" IEEE Transactions on Magnetics, Vol. MAG-13, No. 1, pp. 41-47, January 1977). Originating in the discovery that application of an external magnetic field to the Josephson junction causes to lower the critical current value, these devices utilize the phenomenon that transition of the device from the zero-voltage state to the voltage state is caused by the injection of current into a control line to generate a magnetic field in the proximity of the junction. These devices operate with small power dissipation and entail no problem of emission of heat. Therefore, higher degrees of integration than that in the aforementioned semiconductor devices are possible. When these devices are reduced in size in order to increase their switching speed, their sensitivity is observed to drop with the decrease in the device size. This decline in sensitivity may possibly be precluded by injecting a large current into the control line thereby to increase the magnitude of the magnetic field to be generated. This measure inevitably necessitates extra means for enabling the device to withstand the application of such a large current and impedes materialization of desired integration. Besides, in SQUID type magnetically controlled device (described in the above-mentioned reference literature by H. H. Zappe), the sensitivity of the gate is greatly improved. The reduction of the device size is, however, restricted by the inductance which plays an essential role in the switching operation.

On the other hand, a current injection logic (CIL) device (T. R. Gheewala "Josephson logic circuits based on nonlinear current injection in interferometer devices", Applied Physics Letter Vol. 33(8), pp. 781-783, Oct. 15, 1978) in which the transition of the device from the zero-voltage state to the voltage state is achieved by injecting an input signal current directly into the Josephson junction of the SQUID loop has been proposed. Compared with the former magnetically controlled devices wherein the input signal current pass is isolated from the gate current pass, in the CIL device the current passes of the input signal current and the gate current are directly connected with the passive inductance of the device. This device, therefore, has one disadvantage that when the device switches, the input and output signal currents cannot be isolated from each other.

A current-switched Josephson gate in which the isolation between the input signal current and the gate bias current is achieved with two junctions and a resistor, the slope of the threshold curve is low. (T. A. Fulton et al., "A simple high-performance current-switched Josephson gate", Applied Physics Letter, Vol. 34(10), pp. 709-711, May 15, 1979)

As described above, the conventional Josephson device has been unable to simultaneously satisfy the three conditions, i.e., (1) the size reduction of the device which permits integrated circuits in high density, (2) the high sensitivity which produces wide operation margin, and (3) perfect isolation between the input and output signal currents in the device. The three conditions are indispensable to the components of future electric Josephson computer to obtain a stable logic circuit operation.

SUMMARY OF THE INVENTION

One object of this invention is to provide a Josephson logic gate device which permits highly dense integration of Josephson logic circuits by reducing the size of the switching device, which affords high sensitivity and, at the same time, provides effective isolation of the input and output signal current.

To accomplish the object described above according to this invention, there is provided a Josephson logic gate device, which comprises a closed loop of four Josephson junctions; a gate line connected to the loop between any two adjacent Josephson junctions; a ground line connected to the loop between the two pairs of Josephson junctions, which is opposite to the gate line in the loop; and a control line connected to either of the lines each formed between one pair of Josephson junctions, which are connected to the gate line and the ground line.

The gate current which is fed into the gate line under the zero-voltage state of the gate flows to the ground line through two branches of two series connected junctions without producing any potential difference at the junctions. When the control current is injected into the control line by the application of the gate current, the gate switches to the voltage state. If resistance of the external load is chosen to be smaller than the internal normal resistance of the gate, the gate current can be steered to the load resistor as an output signal. In the device of this construction, a switching operation can be performed at a high speed with high sensitivity without the aid of a magnetic field. Further, since the control current is supplied to the gate through the control line, effective isolation of the input and output currents can be achieved. Use of this gate device permits construction of logic circuits such as AND-circuits, OR-circuits and NOT-circuits which are indispensable to electronic computers. The gate device, therefore, proves to be useful particularly as a component for electronic computers.

The other objects and characteristics of the present invention will become apparent from the further disclosure of the invention to be made hereinafter with reference to the accompanying drawing.

DESCRIPTION OF THE PREFERRED EMBODIMENTS

This invention relates to a logic gate device which is adapted to effect a high-speed switching operation. In the present logic gate, switching of the gate is performed by the injection of the current into a closed loop incorporating four Josephson junctions without the aid of a magnetic field.

Figure 1:
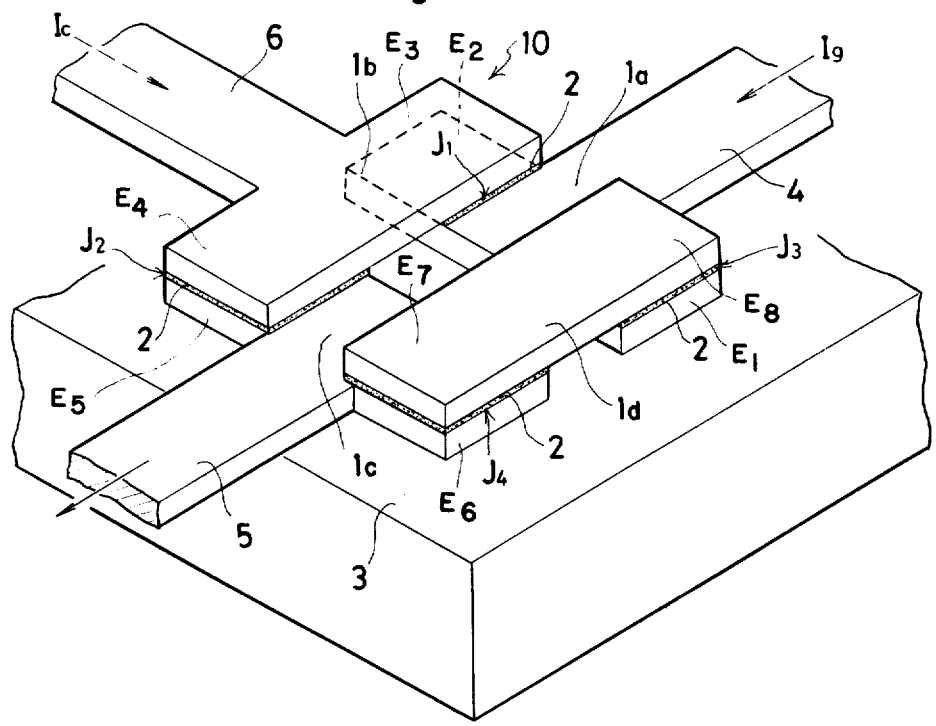
FIG. 1 is a schematic diagram illustrating the basic construction of the gate device according to the present invention.

The basic construction of the first embodiment of the Josephson logic gate device of this invention will be described below with reference to the schematic diagram of FIG. 1. In this embodiment, four superconductors 1 are connected to each other to make a closed loop through insulating films 2 which act as Josephson tunnel junction barriers on the substrate 3. At the point where the superconductors 1 are respectively crossed, they form Josephson tunnel junctions $J_1$, $J_2$, $J_3$ and $J_4$ and, consequently, give rise to the closed loop circuit 10. A current feed line 4 for an input of a gate current $I_g$, hereinafter called "gate line", is connected to the superconductor connecting two adjacent Josephson junctions ($J_1$, $J_3$ in the present embodiment). A ground line 5 is connected to the superconductor connecting the two adjacent Josephson junctions ($J_2$ and $J_4$ in the present embodiment) which is opposite to the joint of the gate line in the loop. A current feed line 6 for an input of the control current $I_c$, hereinafter called "control line", is connected to either of the two super-conductors connecting the two adjacent Josephson junctions of the gate line side and the two adjacent Josephson junctions of the ground line side, which is the superconductor connecting the junctions $J_1$ and $J_2$ in the present embodiment.

Figure 2:
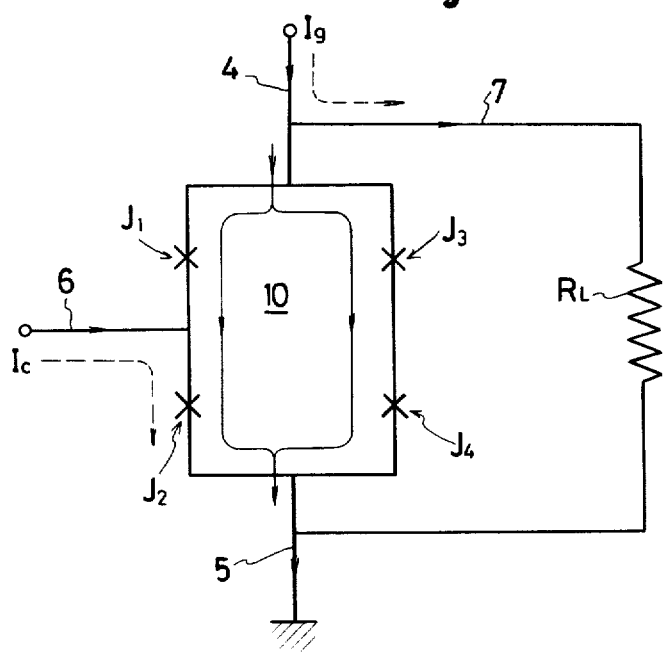
FIG. 2 is a model equivalent circuit diagram of a basic gate circuit based on the device of FIG. 1

As an aid in the comprehension of the operating principle of the Josephson logic gate device which possesses the basic construction described above, a model equivalent circuit of the basic gate using the device is illustrated in FIG. 2. Here, a load circuit which consists of an output line 7 and a load resistor $R_L$ is laid between the gate line 4 and the ground line 5 parallelly to the closed loop circuit 10 incorporating four Josephson junctions $J_1$, $J_2$, $J_3$ and $J_4$.

When a current power source is given between the gate line and the ground line as indicated by the solid line arrow in FIG. 2, the gate current $I_g$ flows from the gate line 4 to the ground line 5 through the closed loop of the four junctions at appropriate values of $I_g$ which retain four junctions in the zero-voltage state and do not allow any resistance in the gate. In this case, no current flows to the load resistor $R_L$ and the line 7 issues no output. When the control current $I_c$, which corresponds to an input signal, is supplied to the control line 6 while the gate is in the zero-voltage state described above as a result of quantum interference between the four Josephson junctions of the gate; first, the junction $J_2$ is transferred from the zero-voltage state to the voltage state and then all the other junctions are transferred from the zero-voltage state to the voltage state, resulting in the switching operation of the gate. If the magnitude of the load resistance of $R_L$ is chosen to be smaller than that of the tunnel resistance of the junction of the gate, the gate current $I_g$ flows to the load as an output signal current via the output line 7. Resetting of the device from the voltage state to the zero-voltage state is accomplished by cutting off the supply of the gate current $I_g$ and the control current $I_c$.

By the procedure described above, a switching operation of the present Josephson switching device is achieved. The switching threshold characteristics of the device in the present embodiment depend on the value of both $I_g$ and $I_c$. The characteristics are also observed to be varied by the critical current value of the four Josephson junctions. Suitable selection of these conditions, therefore, permits improvements in the sensitivity of the gate. The outstanding characteristics of the device of the present invention will be described hereinafter with reference to experimental data.

Figure 3A:
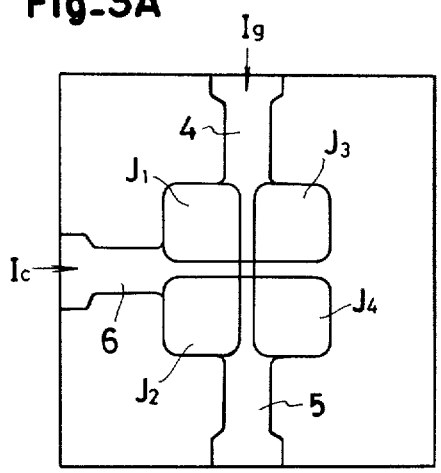
FIGS. 3A, 3B and 3C show a plan view, an equivalent circuit diagram and a threshold characteristics graph of a symmetric gate device as one embodiment of the present invention, respectively.
Figure 3B:
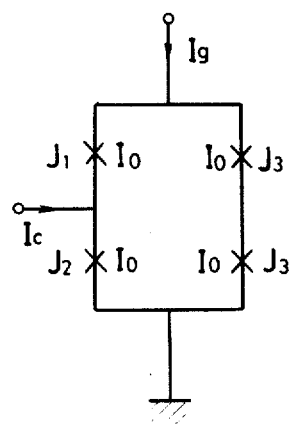
Figure 3C:
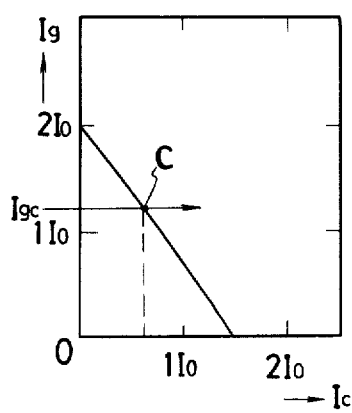

The four Josephson junctions in the device illustrated in FIG. 3A possess equal junction areas and, as shown in the equivalent circuit of FIG. 3B, they possess equivalent critical current value $I_o$. When the control current $I_c$ is applied to this device in which the gate current $I_g$ has been flowing as described above, the device is transferred from the zero-voltage state to the voltage state at the time when the magnitude of the current exceeds the threshold level. This threshold characteristic is represented by a curve substantially approximating a diagonal straight line in the graph of FIG. 3C. Naturally, the magnitude of the gate current supplied here is chosen so that the gate produces no switching operation with the gate current $I_g$ alone. In the graph of FIG. 3C, the inner region of the left of the threshold curve represents the zero-voltage state and the outer region of the right of the curve represents the voltage state. The vertical and horizontal axes represent the magnitudes respectively of the gate current $I_g$ and the control current $I_c$ normalized by the critical current value $I_o$ of the relevant junction. When the gate is operated to cross the threshold curve at the point C for a certain value $I_{gc}$ of the gate current $I_g$ as indicated by the arrow, the gate switches from the zero-voltage state to the voltage state. The fact that the control current is considerably small in comparison with the gate current at this point C means that the gain is high. The slope of the threshold, called a sensitivity, is shown to be about 1.3 which is higher than the sensitivity of unity in a conventional single-junction gate.

Figure 4A:
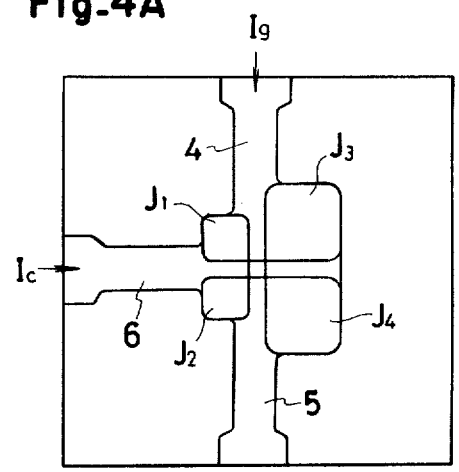
FIGS. 4A, 4B and 4C show a plan view, an equivalent circuit diagram and a threshold characteristics graph of an asymmetric gate device as another embodiment of the present invention, respectively.
Figure 4B:
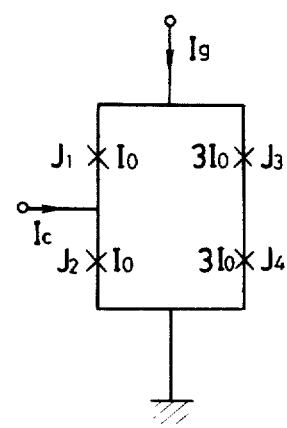
Figure 4C:
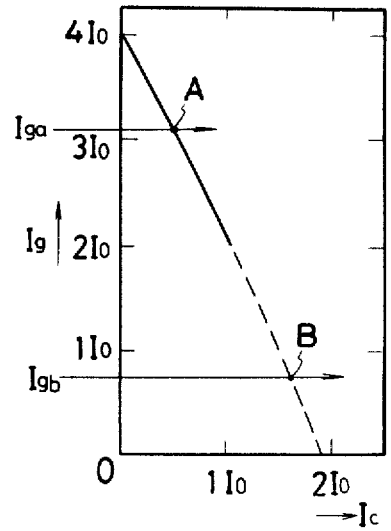

The gate current flows into the two routes of both $J_1$-$J_2$ and $J_3$-$J_4$ of the loop. The device of FIG. 3 in which the critical current of four junctions are the same is called a symmetric gate device. The device of FIG. 4 has the construction of an asymmetric gate wherein the critical current value in the opposite pairs of junctions ($J_1$-$J_2$ and $J_3$-$J_4$) are different. Since the critical current for the junction is proportional to the junction area, the ratio of the critical current between the two pairs of junctions ($J_1$-$J_2$ and $J_3$-$J_4$) is chosen to be 1:3 ($I_o$:$3I_o$) as is illustrated in FIG. 4B. The threshold curve of this asymmetric case is shown in FIG. 4C. In this gate, the switching operation can be performed when the device is operated to cross the solid line of the threshold curve, for instance, as indicated by an arrow at the point A. The dashed line of the threshold curve shows the insensitive region in which the gate does not switch even when the gate is operated to cross the threshold curve, for instance, as indicated by an arrow at the point B.

In this asymmetric gate, a steeper slope of the switching threshold curve is obtained to be about 2 as is shown in FIG. 4C. This means that the gate has a higher sensitivity. Therefore, a wider operating margin can be obtained in the switching operation.

As is indicated by the results of FIGS. 3C and 4C, the switching threshold curve is essentially determined only by the critical current values of the four junctions. The slope of the threshold curve, i.e., the sensitivity of the gate depends only on the ratio of the critical currents between the Josephson junctions of $J_1$-$J_2$ and $J_3$-$J_4$ and does not depend on the absolute values of the critical current. The same sensitivities are obtained in the gates which have the same ratio of the critical Josephson current in the four junctions. This fact proves to be one of advantages of this gate when size reduction of the gate device is attempted. In the conventional SQUID type Josephson devices, since the sensitivity varies with the overall size of the device it is not easy to estimate accurately the sensitivity in a reduced device size. In the device of the present invention, any desired sensitivity can be obtained by merely fixing the relative values of critical current of the four Josephson junctions in the device. The device of this invention, therefore, has one of the advantages that the design of circuit due to a reduction in the size of the device can be accomplished with great ease.

Figure 5A:
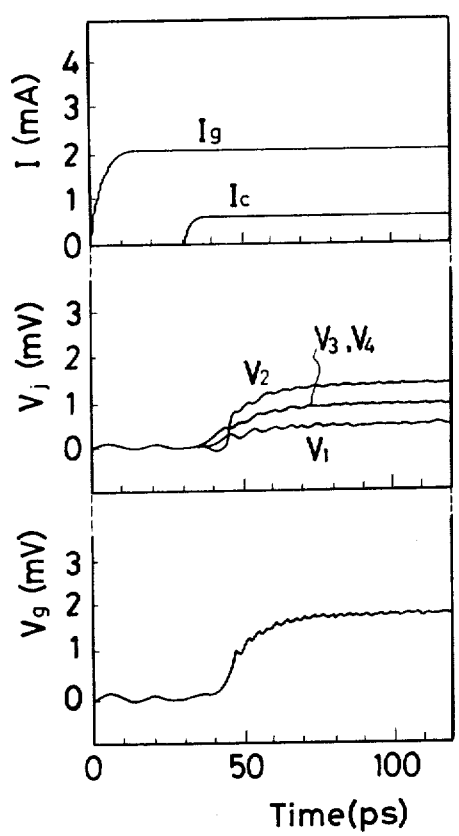
FIGS. 5A and 5B are graphs showing the response characteristics of the device of FIG. 4A for the input of the gate and control current.

The graphs in FIG. 5A obtained by the computer simulations represent the switching responses of the asymmetric gate device under the switching condition of $I_g = I_{ga}$ which is shown in FIG. 4C. The graph in the upper section shows the input signal currents of $I_g$ and $I_c$ with exponential rise-time, which are supplied to the gate line and control line of the device, respectively. The graph in the middle section represents the response characteristics of each of four Josephson junctions which induce the voltage $V_j$ when the gate switches to the voltage state where $V_j$ is the voltage of the j-th junction. The graph is the lower section indicates that the gate switches after about 30 pico-seconds when the control current $I_c$ is injected to the gate.

Figure 5B:
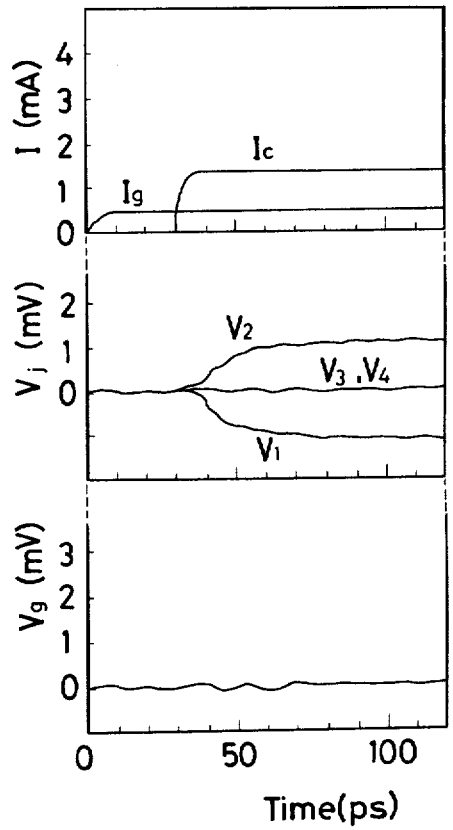

The graph of FIG. 5B also represents the response of the asymmetric gate device of FIG. 4C wherein the gate is operated to cross the dashed line of the threshold curve at the gate current of $I_{gb}$ as shown in the FIG. 4C. The graph in the upper section shows the input control and gate currents. As is clear from the graph in the middle section, the junctions $J_1$ and $J_2$ are switched to the polarity sign in the voltage $V_1$ and $V_2$ and the junctions $J_3$ and $J_4$ do not switch to the voltage state. Therefore, the gate still remains in the zero-voltage state and the gate current does not flow to the load through the output line. This insensitive region appears in the asymmetric gate.

The sensitivity defined by the slope of the threshold curve in FIG. 3C and FIG. 4C is calculated to be about 1.3 in the symmetric gate and about 2 in the asymmetric gate, respectively. It has been experimentally ascertained that these threshold curves obtained by the computer simulations are in good agreement with those of the gates which are fabricated and operated actually. The asymmetric gate exhibits excellent switching operation, because wider operating margins can be obtained in the asymmetric gate. Josephson switching gate devices which actually embody the present invention were obtained by using a superconducting material of Au-In-Pb alloy as a lower superconductor with the aid of the techniques of vacuum deposition and photolithography. The Josephson tunnel junction barriers were made by oxidizing the surface of the lower superconductor by the oxygen-plasma discharge technique thereby producing an oxide barrier film. By overlaying the barrier-oxide film with an upper superconductor of an Au-Pb alloy by the same techniques as used for the lower superconductor, complete Josephson tunnel junctions were fabricated. Of course, the superconducting materials to be used and the structure to be adopted may be freely selected to obtain the switching gate of a closed loop of four Josephson junctions of the present invention.

A logic circuit may be formed by using only one basic gate device of the construction described above or by assembling a plurality of such basic gate devices. Use of such logic circuits permits materialization of a high-speed, high-performance electronic computer. Now, typical examples of such logic circuits will be described below.

Figure 6:
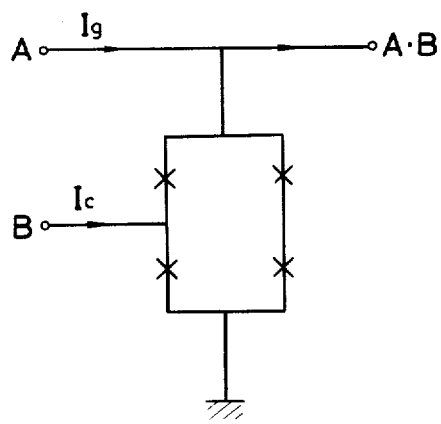
FIGS. 6-12 are logic circuits constructed with the gate device of the present invention.

FIG. 6 illustrates a circuit which performs the "AND" logic function with a single gate device. Let the input signals of A and B correspond to the gate current $I_g$ and the control current $I_c$, respectively. The output signal is obtained at the output line only when the two inputs of both A and B are injected to the gate as is readily understood from the foregoing explanation.

Figure 7:
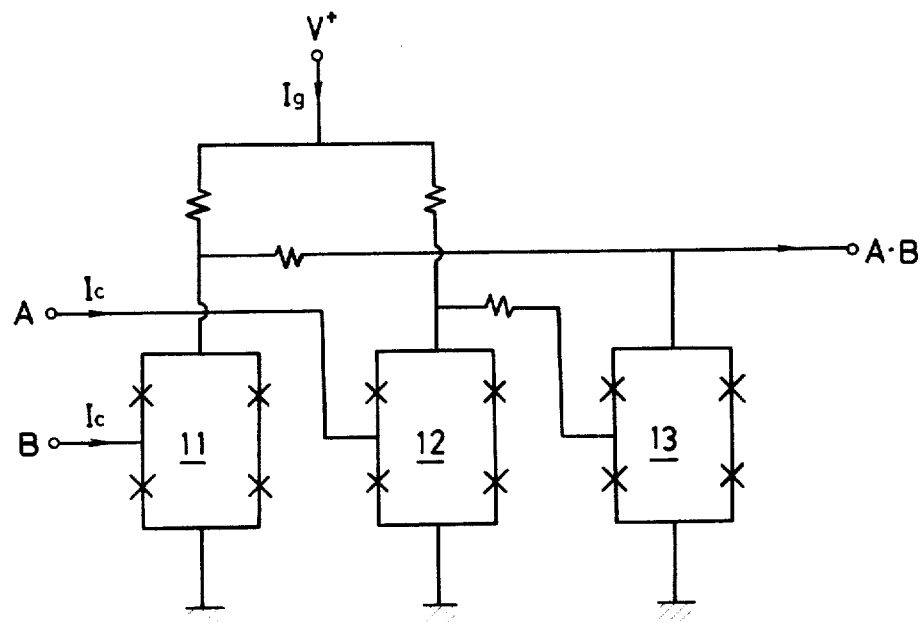

A circuit which performs more stable "AND" logic operation based on the circuit of FIG. 6 is illustrated in FIG. 7. In this circuit the "AND" logic function is performed by the gate of the loop 13. The gate of the closed loops 11 and 12 are provided for supplying the gate and control currents to the loop 13. The loops 11 and 12 are also embodied by the present invention. When the two control currents of the input signals A and B are injected into the gates of the closed loops 11 and 12. The gate 11 and 12 switch and the gate currents of the loops 11 and 12 are steered to the gate of the closed loop 13. The gate current steered from the closed loop 11 is supplied to the gate line of the closed loop 13 as the gate current for the loop 13 and the gate current steered from the loop 12 is supplied to the control line of the loop 13 as a control current of the closed loop 13. Then, the gate of the closed loop 13 switches gate current only when the both input currents A and B are supplied to the control lines of the two closed loops 11 and 12. When either of the input currents A or B is absent, the gate of the closed loop 13 does not switch and then the "AND" logic operation is accomplished.

Figure 8:
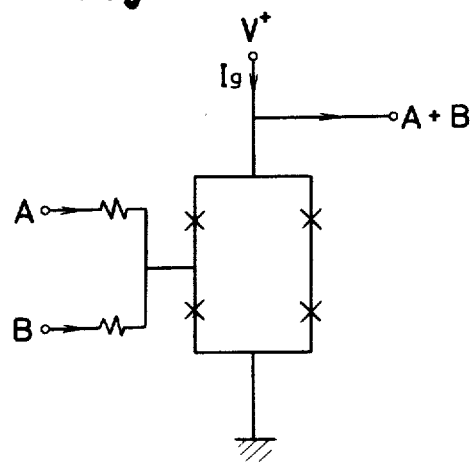

FIG. 8 illustrates the basic construction of an OR circuit using a single gate device. In this embodiment, the input signals of A and B are given to the control line. The gate current $I_g$ can be extracted as the output current only when either or both of the two inputs are present.

Figure 9:
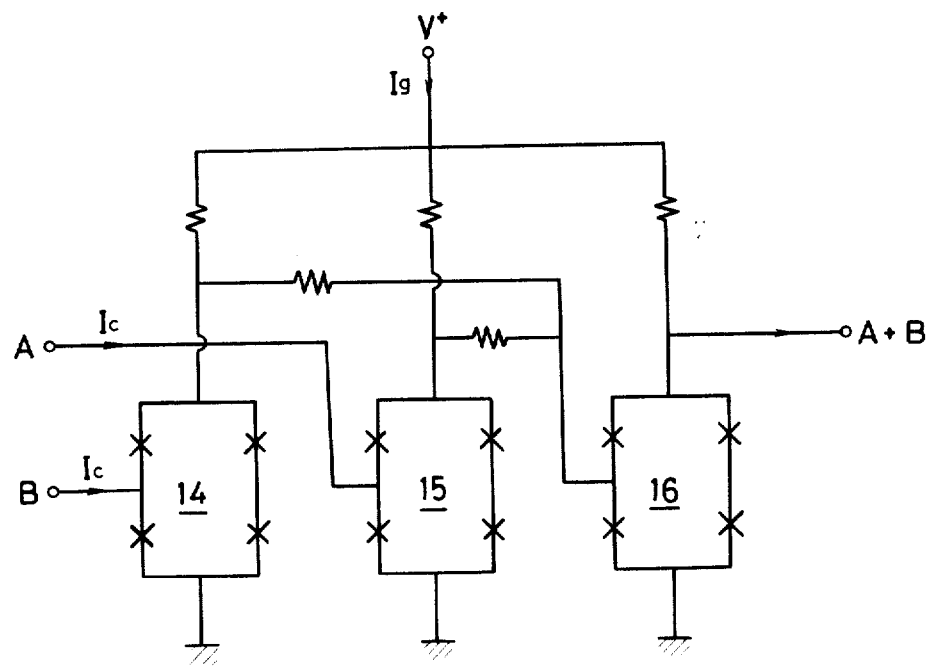

A typical circuit designed to provide a stable OR logic function is illustrated in FIG. 9. This circuit is constructed so that two closed loops 14, 15 are provided on the input side and the outputs from these loops are fed to the other closed loop 16 as the control current. In this arrangement, when either or both of the two input signals of A and B are fed to the corresponding closed loops 14, 15, the closed loop(s) receiving the input signal(s) steer their gate currents to the closed loop 16, which produces an "OR" logic operation and generates its output current.

Figure 10:
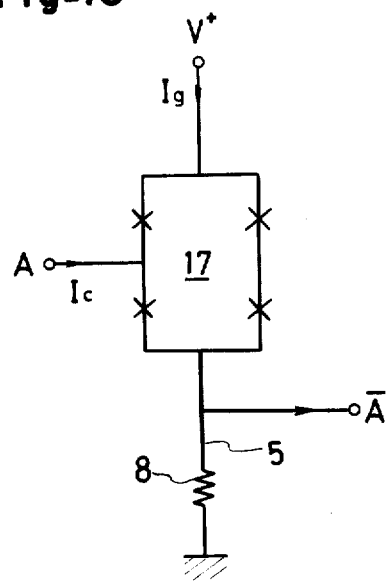
Figure 11:
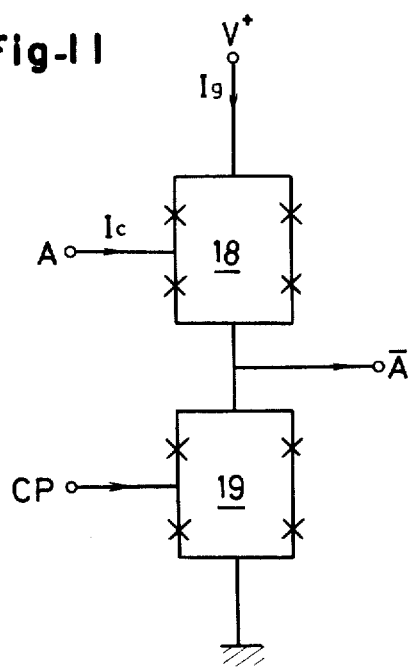
Figure 12:
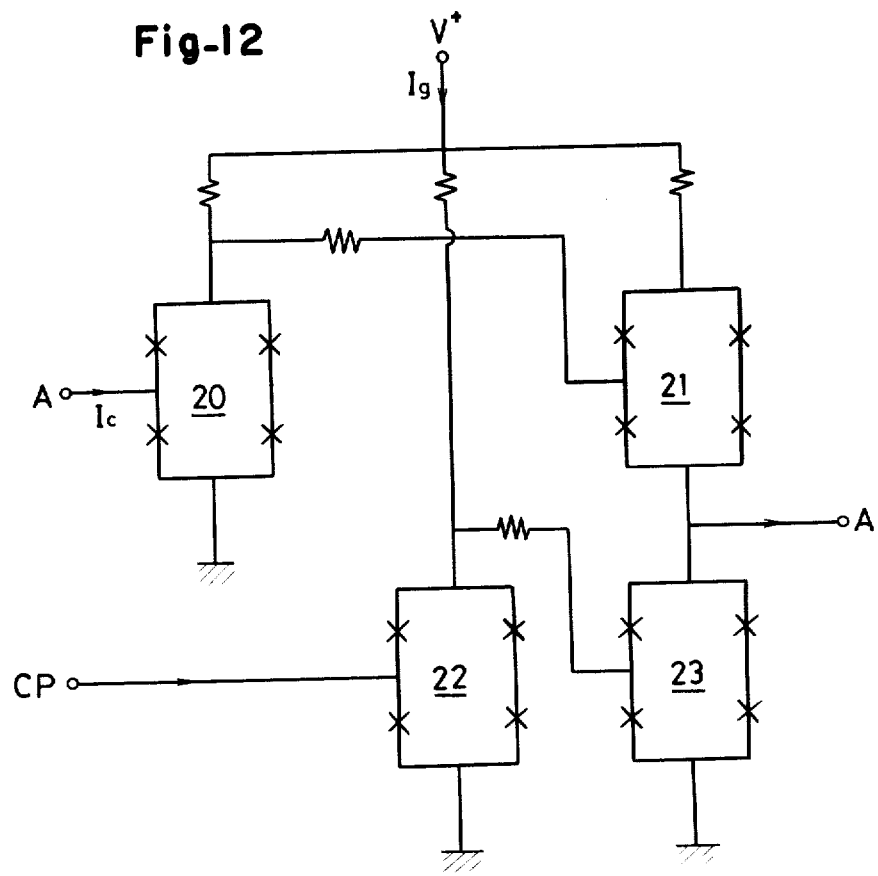

FIGS. 10–12 illustrate NOT circuits. The circuit of FIG. 10 uses only one gate device. In this arrangement, the ground line 5 is provided with a resistance 8 and the output is derived through the line interposed between the closed loop 17 and the resistance 8. When the control current $I_c$ is absent, the gate current $I_g$ flows through the closed loop to the ground line in the zero-voltage state. The gate current, however, is obstructed by the resistance 8 and is caused to find its way toward the output side. In the presence of the input A, the gate of the closed loop 17 switches to the voltage state so that the output signal does not appear at the output terminal. Then the "NOT" logic function is achieved. The closed loop 18 in the circuit of FIG. 11 performs the same "NOT" logic operation as is obtained in the circuit of FIG. 10. It is provided with a timing circuit (closed loop 19) which is effective in the performance of a synchronizing operation as in a processor. When a clock pulse CP is injected to the closed loop 19, the closed loop delivers its output only when the input signal A is absent. A NOT circuit based on the circuit of FIG. 11 in which a plurality of the gates of the closed loops on the input signal side and the timing circuit side are provided is illustrated in FIG. 12. In this arrangement, the gates of the closed loops 20 and 21 switch to the voltage state and deliver no output current when the input signal A is present. The gate current of the loop 23 is steered to the output terminal when the input signal A is absent and the clock pulse CP is present. Therefore the "NOT" logic operation is achieved in the circuit of FIG. 12.

Further development and combination of the basic logic gate circuits described above permit configuration of any sorts of logic circuits. For example, the OR circuit of FIG. 8 can readily be modified into a multi-input gate by adding the number of inputs and into a multi-output gate by increasing the number of output lines. As is described above, a wide variety of applications of the gate device based on the present invention permits the construction of logic circuits such as processors used in electronic computer. Applications of the present switching gate for memory devices in which the gate acts as a switch to store a superconducting current in a closed loop are also possible.

The gate device of this invention permits drastic size reduction without entailing any discernible loss of the sensitivity. The size reduction promises a proportional decrease in the size of electronic computers and their cooling systems. The various problems which have prevented size reduction in the conventional SQUID type devices are solved by the gate device of this invention. In the conventional device, for instance, in the CIL gate, the gate current and the control current can not be isolated when the gate switches. Therefore, complicated logic circuits which consist of only the CIL gate are supposed to act under an unstable operation. In the device of this invention, since the input and output signal currents can be isolated, the stable operation of complicated logic circuits can be realized. Furthermore, in the device of this invention, the switching operation is performed essentially without the aid of inductance, because no inductance element is included in the gate device. The device, therefore, produces super-high-speed operation. The gate device proves to be particularly useful for CPU's such as in high-speed data processing systems. It also promises materialization of a high-speed processor which is readily capable for highly advanced arithmetic operation, which has been found infeasible with the conventional electronic computers using silicon IC's, etc.

What is claimed is:

1. A Josephson logic gate device comprising;
   four superconductor lines (1)
   four insulating films (2) connecting said four superconductor lines with each other at their ends ($E_1$–$E_8$) to form four Josephson junctions ($J_1$–$J_4$), said four superconductor lines (1) and said four insulating films (2) together constituting a closed loop provided with said Josephson junctions ($J_1$–$J_4$),
   a gate line (4) connected to a first one (1a) of said superconductor lines,
   a control line (6) connected to a second (1b) or fourth one (1d) of said superconductor lines, one end ($E_3$, $E_8$) of each of said second and said fourth superconductor lines (1b, 1d) being connected via said insulating film to said first superconductor line (1a), and
   a ground line (5) connected to a third one (1c) of said superconductor lines, both ends ($E_5$, $E_6$) of which are connected via said insulating film to the other ends ($E_4$, $E_7$) of said second and fourth superconductor lines (1b, 1d), whereby the device acts as a switching gate in which a gate current fed to said gate line is steered to a load connected to said gate line (4) and said ground line (5) by using the zero-voltage/voltage state-transition of said four Josephson junctions ($J_1$–$J_4$) when a control current is injected into said control line (6) as an input signal.

2. The Josephson logic gate device according to claim 1, wherein critical currents of the four Josephson junctions of the closed loop are equal.

3. The Josephson logic gate device according to claim 1 wherein the critical currents of the two Josephson junctions in the closed loop connected to said control line and the other Josephson junctions therein are different.

4. The Josephson logic gate device according to any of claims 1, 2 and 3, wherein the said gate line is connected to an output line so that the gate current is extracted to the load through the output line as an output signal resulting from the injection of the control current into the control line.

* * * * *